United States Patent [19]

Jacobus, Jr.

[11] 4,103,180

[45] Jul. 25, 1978

[54] PROPORTIONAL WARMUP TIMER FOR POWER LINE OUTAGES USING STORED CHARGE FOR POWER

[75] Inventor: Nelson Mortimer Jacobus, Jr., Kensington, Md.

[73] Assignee: Communications Satellite Corporation, Washington, D.C.

[21] Appl. No.: 763,206

[22] Filed: Jan. 27, 1977

[51] Int. Cl.² .......................................... H03K 17/28
[52] U.S. Cl. .................................... 307/141; 361/75; 328/72; 328/129
[58] Field of Search .......................... 361/75, 73, 71; 307/141, 141.4, 141.8, 64; 328/86, 72, 129

[56] References Cited

U.S. PATENT DOCUMENTS 3,794,858  2/1974  Squiers ..................................... 361/75
3,939,361  2/1976  Aidala et al. .......................... 307/141

*Primary Examiner*—Herman J. Hohauser
*Attorney, Agent, or Firm*—Sughrue, Rothwell, Mion, Zinn and Macpeak

[57] ABSTRACT

An electronic circuit is disclosed that provides a delay of operation until a piece of equipment reaches operating temperature. The circuit automatically adjusts the delay time to provide only the time necessary for warmup should there be a short outage of line power causing only partial cooling of the equipment. By proportioning the warmup delay time to the time of power loss, the equipment outage can be minimized. The proportionality between the warmup delay time and the time of power loss can be either linear or non-linear depending on the specific application.

10 Claims, 2 Drawing Figures

4,103,180

PROPORTIONAL WARMUP TIMER FOR POWER LINE OUTAGES USING STORED CHARGE FOR POWER

BACKGROUND OF THE INVENTION

The present invention generally relates to timing circuits and more particularly to a proportional warmup timer capable of automatically adjusting the delay time to provide only the warmup time necessary should there be a short outage of line power causing only partial cooling of a piece of equipment.

There are many pieces of equipment which when power is initially turned on or restored after a power line outage must be prevented from operating until the equipment reaches proper operating temperature. Exemplary of such equipment is the power supply of a traveling wave tube amplifier used in the transmitter of microwave communication systems. Timers have been developed which are responsive to the turnon of power to delay the application of high voltage to the amplifier until a sufficient time has elapsed for the equipment to attain proper operating temperature.

One known warmup delay timer is an electromechanical unit. In this unit, an electric motor shaft speed is greatly reduced with gearing to provide a very slow motion to operate a switch. The shaft also winds a spring thereby storing energy. When power is removed, the spring starts to return the shaft to its original position. Should the power be restored before the shaft reaches its original position, the time of delay is reduced resulting in a delay proportional to the time that power was removed from the equipment. This is obviously very beneficial in equipment in which reliability is of prime importance. In the example of microwave communications systems, any equipment outage is at best a serious inconvenience. Therefore, it is advantageous to minimize the equipment outage which results from a power line outage.

While the electromechanical unit has been useful as a proportional warmup timer, it suffers several disadvantages. First of all, the unit is large and relatively unreliable especially when compared with modern integrated circuitry. Because it is an electromechanical unit, it lacks flexibility making it impossible to provide proportionality of restoration time for some periods of the delay and not for others. The spring used to provide a source of stored energy to run the unit after a loss of power is both large and unreliable.

SUMMARY OF THE INVENTION

The present invention is an electronic circuit which automatically adjusts the delay to provide only the warmup time necessary should there be a short outage of line power causing only partial cooling of a piece of equipment. By proportioning the warmup delay to the time of the power loss, the equipment outage can be minimized. The technique used to provide a proportional delay is quite adaptable to many applications. For example, the ratio of proportionality can be different for each of an unlimited number of increments of the delay. Additionally, the degree of proportionality does not need to be constant during a particular increment but may vary by any desired function.

As with the electromechanical unit, there must be a source of stored energy to run the timer after a loss of power. Batteries or another source of power must be available. Dry batteries are costly, have a definite shelf life, must be replaced periodically, are large, and may cause corrosion problems. Wet cells have all of the problems of dry cells except for a longer life and the need for a charger. These problems are avoided in the present invention by using energy stored in a capacitor during normal operation to provide power when the normal source of power is inoperative.

The present invention has several advantages especially when compared with the electromechanical unit. The electronic circuit according to the present invention is very flexible. For example, in a specific application used to control the warmup delay for the power supply of a traveling wave tube amplifier, the timer provides a basic 180 second delay after initial power turn on. After a power outage, the timer provides the following delays: For a power outage of 0 to 2 seconds, there is no delay; for an outage from 2 to 60 seconds, there is a directly proportional delay; and for an outage greater than 60 seconds, the full 180 second delay is provided. In its preferred form, the invention avoids the problems of springs or batteries or alternate power supplies by storing energy in a capacitor which is more reliable than batteries. Since the total circuit is readily fabricated using commercially available integrated circuits, the timer is small, lightweight, highly reliable, and exhibits all of the advantages associated with using standard integrated circuits.

BRIEF DESCRIPTION OF THE DRAWINGS

The foregoing and other objects, advantages, aspects and uses of the invention will become clear from the detailed description which follows with reference to the attached drawings, in which.

DESCRIPTION OF THE PREFERRED EMBODIMENT

Figure 1:
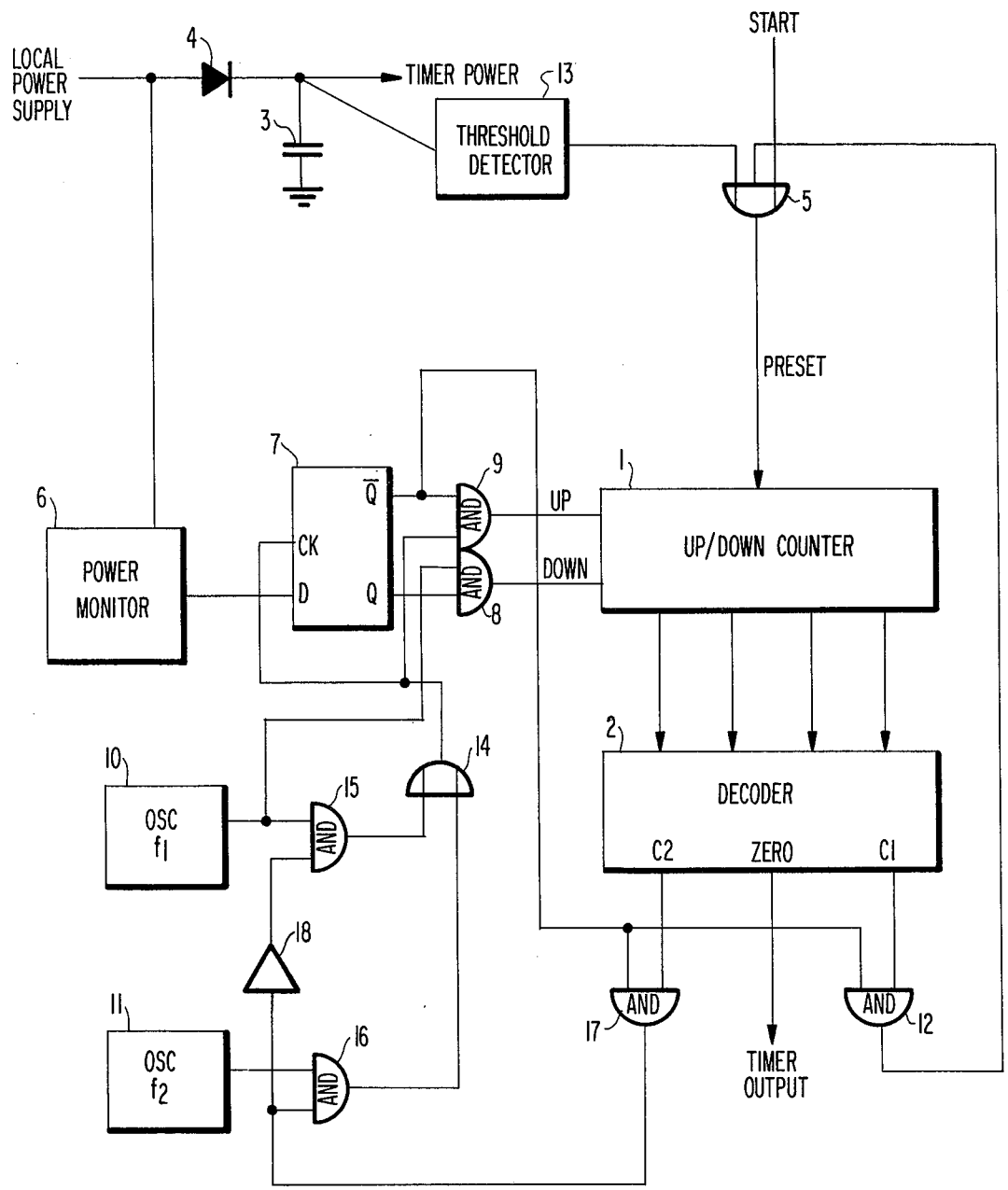
FIG. 1 is a block diagram of an illustrative embodiment of a proportional warmup timer according to the invention.

The basic timer as shown in FIG. 1 includes a counter 1 that can count either up or down, a decoder 2 which comprises several AND gates to determine when the counter 1 has reached a specific count, and logic circuitry which provides switching of the various functions of the timer. The up/down counter 1 can be, for example, several type SN544192 synchronous 4-bit up/-down counters manufactured by Texas Instruments, Inc. and described on pages 427 to 436 of *The TTL Data Book*. As is well known, a plurality of 4-bit binary counters may be used to form a binary coded decimal counter. The decoder 2 can be, for example, several type SN5442A 4-line-to-10-line decoders manufactured by Texas Instruments, Inc. and described on pages 167 to 170 of *The TTL Data Book*. These decoders may be arranged to provide a binary decoded decimal-to-decimal conversion. Such a conversion may be advantageous in applications where operators are provided with the facility for programming the delay times of the timer. It will, of course, be understood by those skilled in the art that the particular up/down counter and decoder is a matter of choice, and the invention is not limited to the use of the specific counters and decoders mentioned herein.

When power is first applied to the equipment for which the warm-up delay time is to be controlled, power is also supplied to the storage capacitor 3 through diode 4. Power is supplied to the timing circuit shown in FIG. 1 by capacitor 3. The diode 4 is polarized so that current is permitted to flow from the local power supply to charge the capacitor 3, but current is blocked to prevent discharge of the capacitor 3 to the local power supply. At turn-on of the local power supply, a start signal is generated and applied through the OR gate 5 to preset the up/down counter to a count equal to the maximum delay of the timer. The power monitor 6 is connected to the local power supply and generates a signal which is applied to the data input D of the edge-triggered flip-flop 7 when power is turned on. The flip-flop 7 is clocked to enable AND gate 8 and disable AND gate 9. In the embodiment illustrated, the AND gates 8 and 9 are supplied with clock pulses generated by either one or the other of oscillators 10 or 11. In the simplest form of the invention, only one oscillator 10, for example, need be provided. In this case, the clock pulses from oscillator 10 would be supplied to the clock input CK of flip-flop 7 and to respective inputs of AND gates 8 and 9. Since the flip-flop 7 enables the AND gate 8 when power is turned on, clock pulses will be applied to the down input of the up/down counter 1. The decoder 2 detects when the counter 1 reaches a count of zero and provides a timer output pulse. In the case of a traveling wave tube amplifier in a microwave communications system, this timer output pulse enables the high voltage supply to the amplifier.

If after initial turnon there is a power line outage, the timer circuit will continue to operate from energy derived from the storage capacitor 3. The choice of the size of the capacitor 3 depends on the power drain of the specific circuits selected to implement the timer and the length of time that the timer must run during a power outage. When a power loss is sensed by the power monitor 6, the signal to the data input D of the flip-flop 7 is removed resulting in the flip-flop being clocked with the next clock pulse to change states. When the flip-flop 7 changes states, AND gate 8 is disabled and AND gate 9 is enabled. Therefore, clock pulses from oscillator 10 are supplied to the up input of the up/down counter 1. The counter 1 will then continue counting up until power is restored at which time the flip-flop 7 will again change states in response to a signal at its data input D, and the up/down counter will then count down from that point until a zero count is detected by the decoder 2. If the power is out for a time longer than the equipment can retain any useful warmth, the counter 1 will reach its maximum delay setting or may be jumped ahead to that value when the counter 1 reaches a predetermined count as it is counted up. This may be accomplished by providing an AND gate 12 which is enabled by the $\overline{Q}$ output of the flip-flop 7. The decoder 2 provides an output C1 to the AND gate 12 when the predetermined count is reached by the counter 1. The output of AND gate 12 is connected to one of the inputs of the OR gate 5 to preset the up/down counter to the count equal to the maximum delay.

Consider now the example of the delays previously given, that is, no delay for an outage of 0 to 2 seconds, a directly proportional delay for an outage of 2 to 60 seconds, and a 180 second delay for an outage greater than 60 seconds. The power monitor 6 provides a delayed output signal to the data input D of the flip-flop 7 so that if the power outage is less than 2 seconds, the data input D of the flip-flop 7 is continuously supplied with the power monitor output signal. If the power outage is greater than 2 seconds, the flip-flop 7 will be clocked to change states causing the up/down counter 1 to begin counting up. If power is restored before 60 seconds has elapsed, the up/down counter 1 will begin counting down and continue to do so until a zero count is detected by the decoder 2. On the other hand, if the power outage is greater than 60 seconds, a count proportional to that time will be detected by the decoder 2 which will provide an output signal C1 to the AND gate 12 resulting in the up/down counter being preset to the maximum 180 second delay. Thus, in the case of power outages greater than 60 seconds, the timer circuit will react to power turn on with no memory of past events and the maximum warmup delay will be provided. However, if the power outage is relatively short, i.e., between 2 and 60 seconds, the timer circuit will produce a proportionately shorter delay.

Besides the functions thus far described, there may be circumstances in which reliability of the timer will be enhanced by providing a threshold detector 13 to monitor the energy stored in the capacitor 3. More specifically, during times of power outage, the power drain from the capacitor 3 by the timer circuit will result in the voltage across capacitor 3 gradually decreasing. This voltage may reach a level where reliable operation of the timer circuit becomes questionable. Should this occur, the threshold detector 13 would generate an output pulse which is applied through the OR gate 5 to preset the up/down counter 1 to a count equal to the maximum delay.

Those skilled in the art will recognize that there are many possible variations to the basic timer circuit which has been described to this point. Obviously, the up/down counter 1 could be preset to zero and operate to count up to the delay time in a manner just reversed from that which has been described. Another variation which may be useful for some applications is to switch between the oscillators 10 and 11 to provide different frequency clock pulses to thereby provide a non-linear proportionality between the delay time and the duration of the power outage. For purposes of the description, oscillator 10 is assumed to produce clock pulses at a frequency $f_1$, and oscillator 11 is assumed to produce clock pulses at a frequency $f_2$ where $f_2 > f_1$. Clock pulses from one of the oscillators 10 or 11 are supplied to the OR gate 14 by AND gates 15 and 16, respectively. The output of the OR gate 14 is connected to one input of the AND gate 9 and the clock input CK of the flip-flop 7. As before, the output of the oscillator 10 is directly connected to one input of AND gate 8. The AND gates 15 and 16 are controlled by an output from the decoder 2. More specifically, an output C2 from the decoder 2 corresponding to a predetermined count in the up/down counter 1 is connected to one input of an AND gate 17. The AND gate 17 is enabled by the $\overline{Q}$ output from the flip-flop 7. The output of the AND gate 17 is directly connected to one input of the AND gate 16 and via inverter or NOT gate 18 to one input of the AND gate 15.

Figure 2:
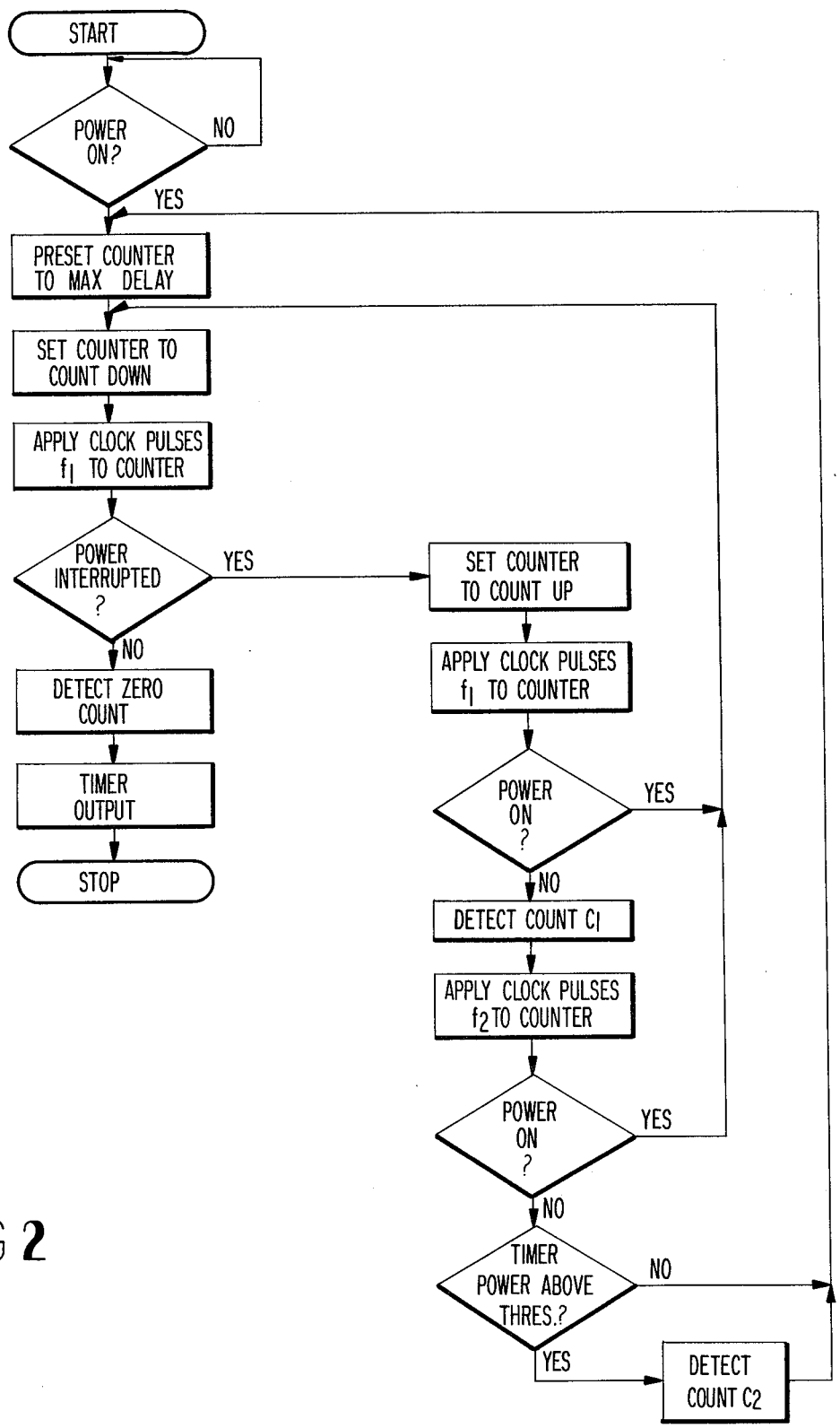
FIG. 2 is a flow diagram illustrating the operation sequence of the timer illustrated in FIG. 1.

In the variation of the basic timer circuit just described, when a power outage is detected by the power monitor 6, the up/down counter 1 begins to count up at rate equal to the frequency $f_1$. Should the count in the up/down counter 1 reach a value corresponding to the output of C2 of the decoder 2, then the up/down counter 1 would continue to count up but at a faster rate equal to the frequency $f_2$. Should the power be restored after that time, the up/down counter 1 would begin counting down from that point at a rate equal to the frequency $f_1$. It will thus be appreciated that the timer is capable of providing time delays which have any desired proportionality to the power outage duration. Obviously, the timer is not limited to the use of one or even two oscillators as any number could be employed to provide the desired proportionality function. It is also possible to frequency modulate these oscillators to provide further versatility in the relationship of power outage to delay time. The changes in the clock oscillators may be made either during the power outage time, the delay time, or both. If the power monitor 6 is observing only the power to the equipment requiring the time delay, a start command may be inferred from the turnon of power to the equipment, and a separate command to preset the up/down counter 1 could be eliminated. The operation of the time illustrated in FIG. 1 is summarized by the flow diagram shown in FIG. 2.

The invention has been described in terms of a preferred embodiment in a basic configuration and one modification thereof, but those skilled in the art will recognized that the invention can be practiced in other and different variations and modifications without departing from the scope of the appended claims.

What is claimed is:

1. A proportional warmup timer responsive to power line outages for proportioning the warmup delay for equipment supplied by said power line to the time of power loss, said timer comprising:
   means connected to said power line for detecting a power line outage,
   an up/down counter,
   means responsive to said detecting means for controlling said up/down counter to count in a first direction at a first rate when a power line outage is detected and to count in a second direction at a second rate when power is restored, and
   means for decoding the output of said up/down counter and generating a timer output when a first predetermined count is reached.

2. A proportional warmup timer as recited in claim 1 further comprising:
   a capacitor connected across said power line for storing a charge, and
   a diode interposed between said power line and said capacitor for allowing current flow only from said power line to said capacitor, said capacitor supplying power to said proportional warmup timer.

3. A proportional warmup timer as recited in claim 2 further comprising means responsive to an initial power on signal to preset said up/down counter to a second predetermined count.

4. A proportional warmup timer as recited in claim 2, further comprising a threshold detector connected to said capacitor for presetting said up/down counter to a second predetermined count when the voltage across said capacitor falls below a predetermined level.

5. A proportional warmup timer as recited in claim 2 further comprising means responsive to said decoding means to preset said up/down counter to a second predetermined count when a third predetermined count is reached by said up/down counter.

6. A proportional warmup timer is recited in claim 2 further comprising means responsive to both an initial power on signal and said decoding means to preset said up/down counter to a second predetermined count either on the occurrence of the initial power on signal or when a third predetermined count is reached by said up/down counter.

7. A proportional warmup timer as recited in claim 2 wherein said means for controlling said up/down counter comprises:
   oscillator means for generating clock pulses, and
   gating means responsive to said detecting means for supplying said clock pulses to said up/down counter.

8. A proportional warmup timer as recited in claim 7 wherein said oscillator means comprises a first oscillator generating clock pulses at a first frequency and a second oscillator generating clock pulses at a second frequency, and said gating means is responsive to said decoding means for selectively supplying clock pulses of said first or second frequencies to said up/down counter.

9. A proportional warmup timer as recited in claim 7 wherein said oscillator means comprises a first oscillator generating clock pulses at a first frequency and a second oscillator generating clock pulses at a second frequency, and said gating means is responsive to said detecting means and said decoding means to initially supply clock pulses at said first frequency to said up/down counter when a power line outage is detected and upon the up/down counter reaching a second predetermined count to thereafter supply clock pulses at said second frequency to said up/down counter.

10. A proportional warmup timer as recited in claim 9 wherein said gating means is further responsive to said detecting means to supply clock pulses at said first frequency to said up/down counter when power is restored.

* * * * *